United States Patent
Okabe et al.

(10) Patent No.: US 10,304,702 B2
(45) Date of Patent: May 28, 2019

(54) EFEM

(71) Applicant: TDK CORPORATION, Minato-ku, Tokyo (JP)

(72) Inventors: Tsutomu Okabe, Tokyo (JP); Hidetoshi Horibe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 239 days.

(21) Appl. No.: 15/372,756

(22) Filed: Dec. 8, 2016

(65) Prior Publication Data

US 2017/0170042 A1    Jun. 15, 2017

(30) Foreign Application Priority Data

Dec. 11, 2015 (JP) .................. 2015-242036

(51) Int. Cl.
| | |
|---|---|
| *H01L 21/67* | (2006.01) |
| *H01L 21/02* | (2006.01) |
| *H01L 21/673* | (2006.01) |
| *H01L 21/677* | (2006.01) |

(52) U.S. Cl.
CPC .. *H01L 21/67017* (2013.01); *H01L 21/02046* (2013.01); *H01L 21/67353* (2013.01); *H01L 21/67393* (2013.01); *H01L 21/67772* (2013.01); *H01L 21/67775* (2013.01); *B65G 2201/0297* (2013.01)

(58) Field of Classification Search
CPC ......... H01L 21/67772; H01L 21/67017; H01L 21/67775; H01L 21/67196
See application file for complete search history.

(56) References Cited

U.S. PATENT DOCUMENTS

| | | | |
|---|---|---|---|
| 6,368,411 B2 * | 4/2002 | Roberson, Jr. .... | H01L 21/67017 118/715 |
| 7,077,173 B2 * | 7/2006 | Tokunaga ......... | H01L 21/67017 141/66 |

(Continued)

FOREIGN PATENT DOCUMENTS

| | | |
|---|---|---|
| JP | 2004-200669 A | 7/2004 |
| JP | 2007-005607 A | 1/2007 |

OTHER PUBLICATIONS

Machine translation of JP2004200669, retrieved from espacenet.com.*

*Primary Examiner* — Timothy L Maust
*Assistant Examiner* — Timothy P. Kelly
(74) *Attorney, Agent, or Firm* — Oliff PLC

(57) ABSTRACT

An EFEM includes a wafer transportation part having a wafer transportation room passed by a wafer transported to a processing room and a load port part airtightly connecting a main opening formed on a container housing the wafer to the room. The transportation part includes a downward current forming device for forming a downward current in the room and a current plate arranged in the room and partly introducing the current into the container connected to the room via the opening. The load port part includes an installation stand for installing the container, a bottom nozzle for communicating with a bottom hole formed at a position distant from the opening more than a bottom surface middle on a bottom surface of the container, and a gas discharge passage for discharging a gas in the container to an outside thereof via the nozzle.

14 Claims, 12 Drawing Sheets

(56) References Cited

U.S. PATENT DOCUMENTS

| | | | |
|---|---|---|---|
| 8,522,836 B2* | 9/2013 | Okabe | H01L 21/67393 141/286 |
| 2009/0035100 A1* | 2/2009 | Okabe | H01L 21/67772 414/217 |

* cited by examiner

EFEM

BACKGROUND OF THE INVENTION

1. Field of the Invention

The present invention relates to an EFEM, and more specifically relates to an EFEM including a wafer transportation part with a wafer transportation room and a load port part.

2. Description of the Related Art

In manufacturing steps of semiconductors, wafers are transported between respective processing apparatuses using a container called a FOUP or so. When the wafers are processed, the wafers in the container are transported from a FOUP to a processing room via an Equipment Front End Module (EFEM) equipped with the respective processing apparatuses.

In the environment of a container housing wafers, it is preferred to maintain an inactive state and a cleanliness that exceed a predetermined level so as to protect the surfaces of the wafers from oxidation and contamination. As a method for improving an inactive state and a cleanliness of a gas in the transportation container, Patent Document 1 proposes a load port apparatus introducing a cleaning gas into a transportation container via a bottom hole formed on the bottom surface of the transportation container and an EFEM containing the load port apparatus.

Patent Document 1: JP 2007-5607A

SUMMARY OF THE INVENTION

As a result of miniaturization of semiconductor circuits, a higher cleanliness has been also recently demanded in the internal environment of the container housing the wafers so as to protect the wafer surfaces from oxidation and contamination. In the course of development for an EFEM maintaining a clean environment of the wafer container, it turned out that there is a problem that the wafer surface before or after processing to be housed in the container is contaminated by an outgas generated from the wafers soon after being processed, and that this contributes to prevention from improvement in quality.

The prevent invention has been achieved under such circumstances and provides an EFEM capable of maintaining a clean environment in a container and protecting a wafer surface from oxidation and contamination.

To achieve the above object, the EFEM according to the present invention is an EFEM including a wafer transportation part configured to have a wafer transportation room passed by a wafer transported to a processing room and a load port part configured to airtightly connect a main opening formed on a container housing the wafer to the wafer transportation room, wherein the wafer transportation part includes:

a downward current forming means configured to form a downward current in the wafer transportation room; and a current plate arranged in the wafer transportation room and configured to introduce a part of the downward current into the container connected to the wafer transportation room via the main opening, and the load port part includes:

an installation stand configured to install the container;

a bottom nozzle configured to be capable of communicating with a bottom hole formed at a position distant from the main opening more than a bottom surface middle on a bottom surface of the container; and a gas discharge passage configured to be capable of discharging a gas in the container to an outside of the container via the bottom nozzle.

In the EFEM according to the present invention, the part of the downward current in the wafer transportation room flows into the container due to the current plate, and the gas in the container is discharged via the bottom hole connected to the bottom nozzle. It is thus possible to form the current in the container and efficiently discharge an outgas generated from the wafer soon after being processed to the outside of the container. The EFEM can thus maintain a clean environment in the container and protect the wafer surface from oxidation and contamination.

The load port part may include a forcible discharge means arranged in the gas discharge passage and configured to forcibly discharge the gas in the container.

When the load port part has the forcible discharge means, the outgas generated from the wafer can be more effectively discharged to the outside of the container.

For example, the wafer transportation part may include a circulating passage where the gas from the wafer transportation room detours and rises so as to form the downward current once again in the wafer transportation room, and a circulating gas cleaning means configured to clean the gas circulating in the wafer transportation room and the circulating passage.

When the wafer transportation part has the circulating passage and the circulating gas cleaning means, the EFEM can improve the cleanliness in the wafer transportation room and restrain consumption of the cleaning gas or so by circulating the gas. The gas of the EFEM flows into the container by the current plate, and thus the EFEM can also improve the cleanliness in the container at the same time.

For example, the EFEM according to the present invention may further include a gas blow means arranged in the wafer transportation room and configured to blow the gas from the wafer transportation room to the main opening.

The EFEM having the gas blow means can increase the cleanliness in the container by blowing the cleaning gas or so toward the main opening of the container.

For example, the gas discharge passage may be connected to the wafer transportation room.

When the gas discharge passage is connected to the wafer transportation room, the gas in the wafer transportation room and the container connected thereto can circulate in the entire EFEM. When the load port part and the wafer transportation room have a common gas cleaning means, the configuration of the apparatus can be simplified.

For example, the load port part may include a discharge gas cleaning means configured to clean the gas flowing in the gas discharge passage.

The discharge gas cleaning means can clean the gas discharged from the container in the load port part by removing contaminants contained in the outgas or so generated from the processed wafer. Thus, the EFEM can prevent the contaminants contained in the gas discharged from the container from moving the outside of the load port part, such as the wafer transportation room.

For example, the wafer transportation part may include a circulating passage where the gas from the wafer transportation room detours and rises so as to form the downward current once again in the wafer transportation room, and the gas discharge passage may be connected to the circulating passage.

In the EFEM, the gas discharged from the container is returned to the wafer transportation room via the circulating passage, and it is thus possible to circulate the gas in the wafer transportation room and the container connected thereto in the entire EFEM while preventing the contaminants contained in the gas discharged from the container from directly flowing into the wafer transportation room.

For example, the EFEM according to the present invention may further include a container inner nozzle standing upright inside the container, wherein the container inner nozzle includes a container inner passage formed inside the container inner nozzle and configured to communicate with the bottom nozzle via the bottom hole, and a passage opening formed intermittently or continuously in an up and down direction on the container inner nozzle and configured to connect to the container inner passage.

For example, the container inner nozzle may include a plurality of opening arrays consisting of the passage openings formed intermittently or continuously in the up and down direction on a surface of the container inner nozzle.

The EFEM has the container inner nozzle, and thus can more effectively discharge the outgas generated from the wafer to the outside of the container. The EFEM has the plurality of opening arrays, and thus can form the current more efficiently discharging the outgas in the entire container.

DESCRIPTION OF THE PREFERRED EMBODIMENTS

Hereinafter, the present invention will be described based on embodiments shown in the figures.

Figure 1:
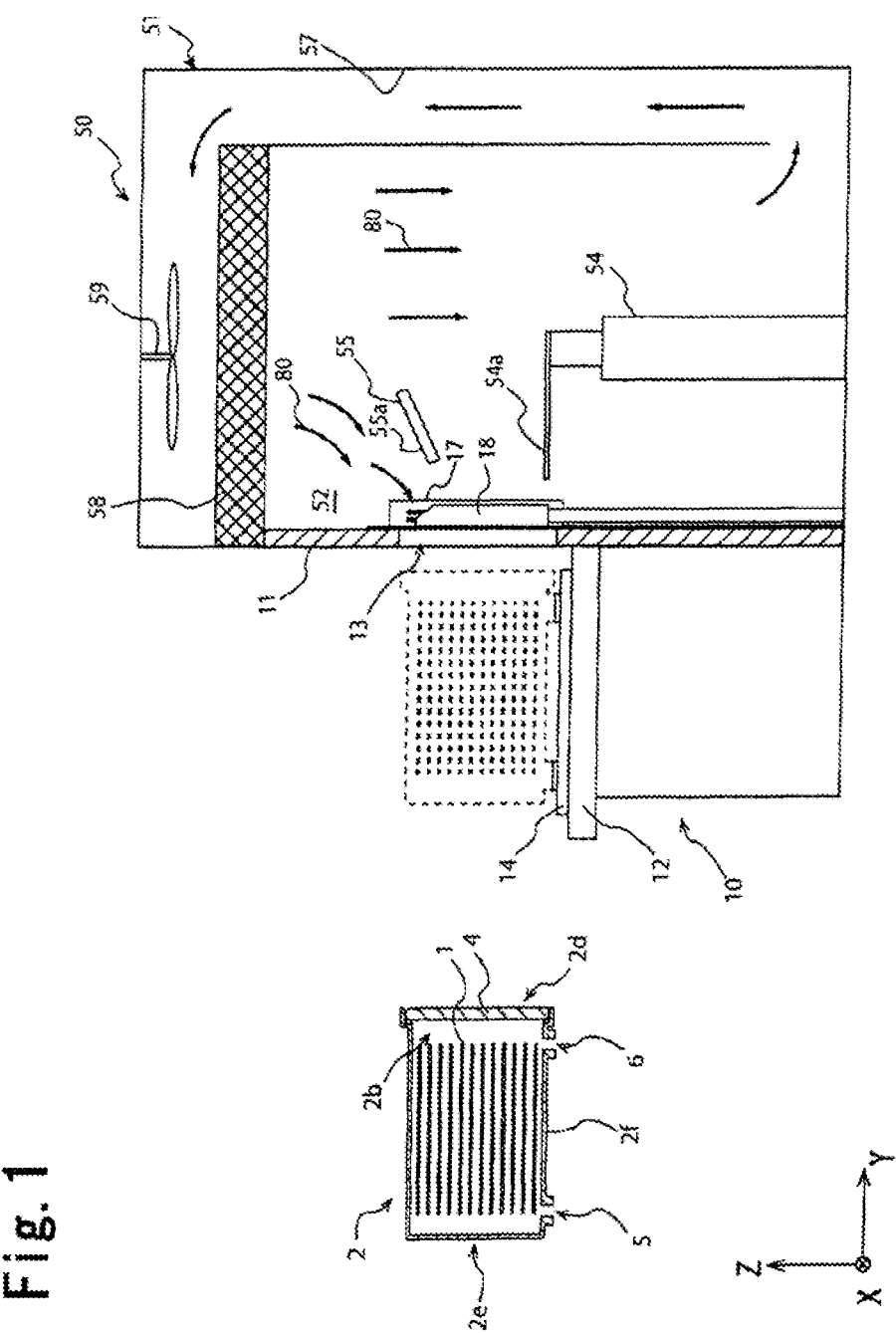
FIG. 1 is a schematic view of an EFEM according to an embodiment of the present invention.

As shown in FIG. 1, an EFEM 50 according to an embodiment of the present invention is a front end module of a semiconductor processing apparatus, and has a load port part 10 and a wafer transportation part 51. A wafer transportation room 52 of the EFEM 50 is a space connecting between a FOUP 2 as a container for transporting wafers 1 and a processing room (not shown). A transportation robot 54 arranged in the wafer transportation room 52 transports the wafers 1 in the FOUP 2 to the processing room. Thus, the wafers 1 subjected to a predetermined processing in the processing room are transported from the inside of the FOUP 2 to the processing room via the wafer transportation room 52.

In addition to the wafer transportation room 52 passed by the wafers 1, the wafer transportation part 51 has a transportation room fan 59 and a circulating passage 57. The transportation room fan 59 is a downward current forming means and forms a downward current 80 in the wafer transportation room. The circulating passage 57 is where a gas in the wafer transportation room 52 detours and rises to form the downward current 80 once again in the wafer transportation room 52. As described below, the wafer transportation part 51 also has a transportation room filter 58 and a current plate 55.

The transportation room fan 59 is provided over the wafer transportation room 52 and forms a current in the wafer transportation room 52 and the circulating passage 57. For example, the transportation room fan 59 has blades inclined toward a rotation direction and a motor for rotating the blades. Incidentally, the downward current forming means is not limited to the transportation room fan 59 having the rotating blades, and another current forming means, such as air compressor, may be employed as the downward current forming means of the wafer transportation part 51.

The circulating passage 57 is connected to the wafer transportation room 52 at upper and lower parts of the wafer transportation part 51, and the space between the upper and lower parts is divided by an intermediate wall with respect to the wafer transportation room 52. A transportation room filter 58 as a circulating gas cleaning means for cleaning the gas circulating in the wafer transportation room 52 and the circulating passage 57 is arranged between the wafer transportation room 52 and the circulating passage 57. The transportation room filter 58 is arranged above the wafer transportation room 52 and below the transportation room fan 59. For example, the transportation room filter 58 is made of an ULPA filter, but is not limited. The transportation room filter 58 and the transportation room fan 59 may consist of an integrated unit (fan filter unit), but may consist of different parts.

The transportation room fan 59 forms a current in the direction shown by thick arrows in FIG. 1. The gas raised in the circulating passage 57 passes through the transportation room filter 58, is cleaned, and then flows into the wafer transportation room 52 due to the blowing effect of the transportation room fan 59. Furthermore, the gas flown into the wafer transportation room 52 falls in the wafer transportation room 52 and flows into the circulating passage 57 from a lower communication port. Then, the gas flown into the circulating passage 57 rises. In this way, a circulating current is formed in the wafer transportation room 52 and the circulating passage 57 by forming the downward current 80 in the wafer transportation room 52 and by forming the upward current in the circulating passage 57.

Figure 4:
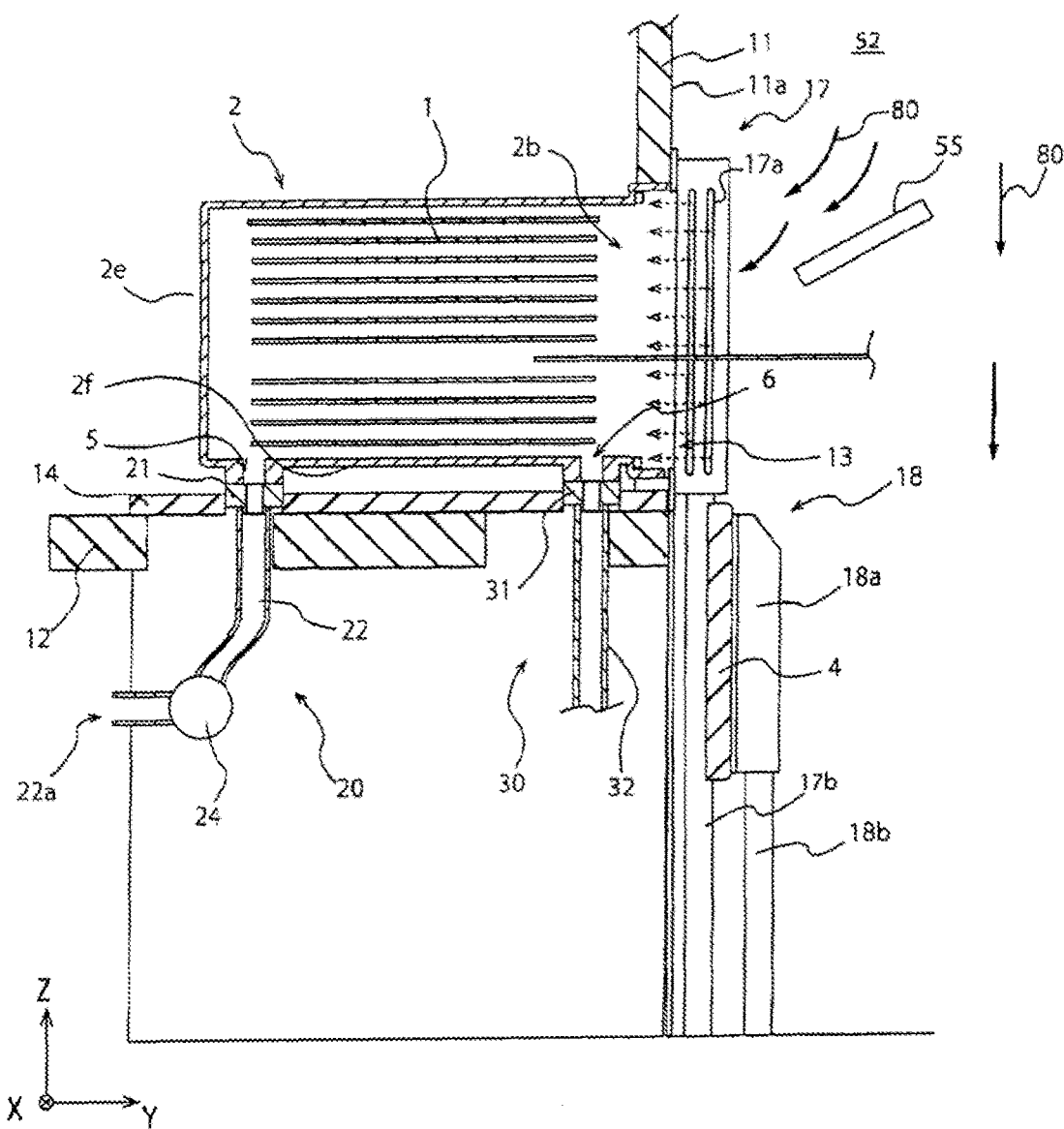
FIG. 4 is a conceptual figure showing a state of the EFEM in a vicinity of a door in a state where a main opening of a container is opened.

The current plate 55 is arranged in a vicinity of a delivery port 13 of the wafer transportation room 52. The current plate 55 has an inclined surface 55a inclined toward a horizontal direction, and a part of the downward current formed in the wafer transportation room 52 collides with the current plate 55 and changes its moving direction. As shown in FIG. 1, the inclined surface 55a is inclined obliquely downward from the middle of the wafer transportation room 52 toward the delivery port 13. Thus, a door 18a is opened as shown in FIG. 4, and the part of the downward current 80 formed in the wafer transportation room 52 is guided by the inclined surface 55a of the current plate 55 and thereby flows into the FOUP 2 connected to the wafer transportation room 52 via the main opening 2b in a state where the FOUP 2 is communicated with the wafer transportation room 52 via the main opening 2b.

Figure 3:
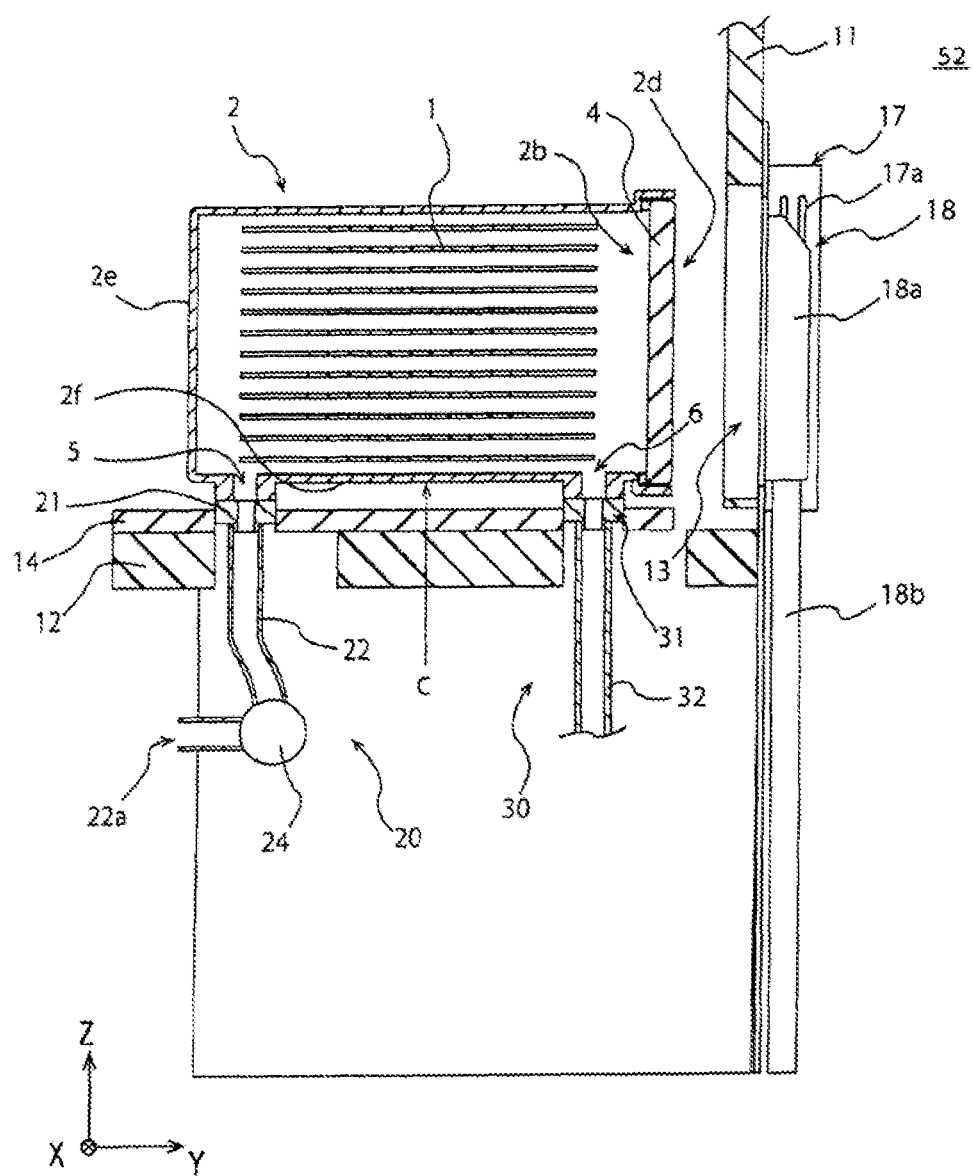
FIG. 3 is a conceptual figure showing a state of the EFEM in a vicinity of a door in a state where a main opening of a container is closed.

The load port part 10 shown in FIG. 1 has an installation stand 14 for installing the FOUP 2, an opening and closing part 18 for opening and closing the main opening 2b of the FOUP 2, and a front gas introduction part 17 for introducing a cleaning gas from the main opening 2b into the FOUP 2. As shown in FIG. 3, the load port part 10 has a gas discharge part 20 and a bottom gas introduction part 30. The gas discharge part 20 can discharge the gas in the FOUP 2 to the outside via a first bottom hole 5 formed on the FOUP 2. The bottom gas introduction part 30 introduces a cleaning gas into the FOUP 2 via a second bottom hole 6 formed on the FOUP 2. As described below, the load port part 10 can airtightly connect the main opening 2b formed on the FOUP 2 containing the wafers 1 to the wafer transportation room 52.

As shown in FIG. 1, the installation stand 14 of the load port part 10 is arranged on a fixing stand 12 and is movable to the fixing stand 12 in the Y-axis direction. Incidentally, the Y-axis is a moving direction of the installation stand 14, the Z-axis is an up and down direction of a vertical direction, and the X-axis is a vertical direction to the Y-axis and the Z-axis.

The FOUP 2 for sealing a plurality of the wafers 1 as housed objects for storage and transportation can be detachably installed on the top in the Z-axis of the installation stand 14. The space for housing the wafers 1 is formed in the FOUP 2. The FOUP 2 has a box shape having a plurality of side surfaces positioned in the horizontal direction toward the inside of the FOUP 2 and a top surface and a bottom surface 2f positioned in the up and down direction. The main opening 2b for taking in and out the wafers 1 housed in the FOUP 2 is formed on a first side surface 2d. The first side surface 2d is one of the multiple side surfaces of the FOUP 2.

The FOUP 2 also has a lid 4 for sealing the main opening 2b. Shelves (not shown) for vertically overlapping the multiple wafers 1 held horizontally are arranged in the FOUP 2. Each of the wafers 1 placed on the shelves is housed in the FOUP 2 at regular intervals. The first bottom hole 5 and the second bottom hole 6 are formed on the bottom surface 2f of the FOUP 2. Structure and function of the first bottom hole 5 and the second bottom hole 6 will be described below.

The load port part 10 is an apparatus for the Front Opening Unified Pod (FOUP) 2 as shown in FIG. 1, but is also applicable to a sealed transportation container having a structure where an opening for taking in and out the wafers 1 is formed on a side surface in the same manner as the FOUP 2. The EFEM 50 can open the main opening 2b formed on the side surface of the FOUP 2 using the load port part 10, and can further transport the wafers housed in the FOUP 2 to the inside of the processing room via the wafer transportation room 52 maintained in a clean state using the transportation robot 54. The EFEM 50 can transport the wafers 1 that have been subjected to processing in the processing room from the processing room to the inside of the FOUP 2 using the transportation robot 54, can close the main opening 2b using the load port part 10, and can house the processed wafers 1 in the FOUP 2.

Figure 2:
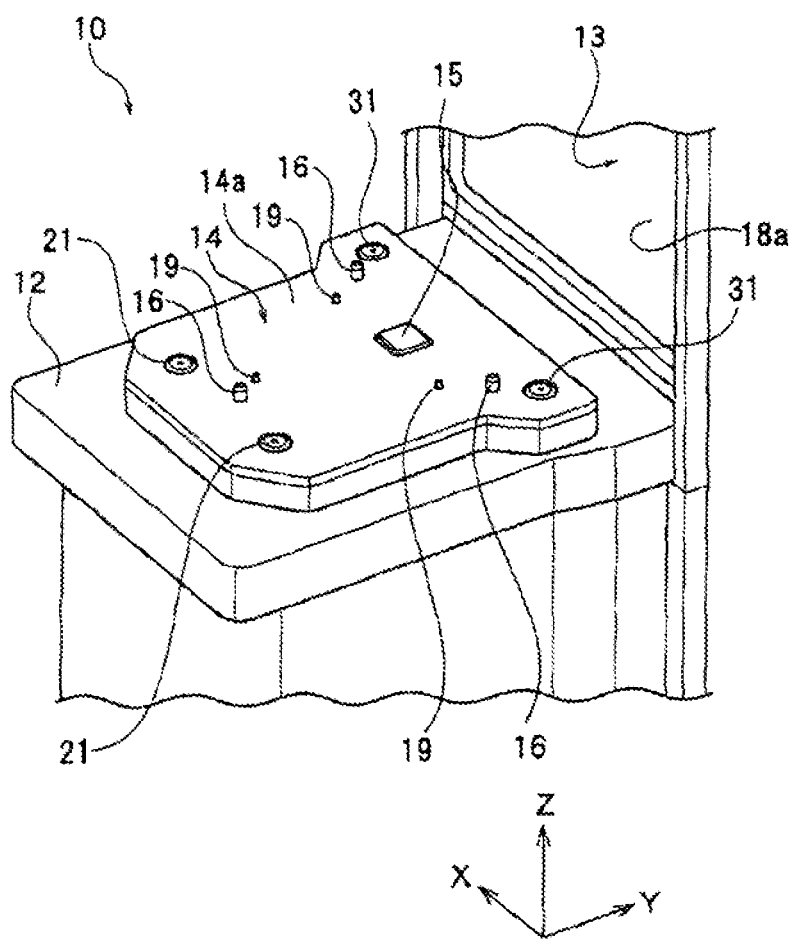
FIG. 2 is a perspective view of a main part showing a vicinity of an installation stand of the EFEM shown in FIG. 1.

FIG. 2 is a perspective view of a main part showing a vicinity of the installation stand 14 of the load port part 10. One or more (preferably three) positioning pins 16 are embedded on a top surface 14a of the installation stand 14. The positioning pins 16 are engaged with positioning portions (not shown) arranged on the bottom surface 2f of the FOUP 2. This uniquely determines a positional relation of the X-axis and the Y-axis between the FOUP 2 and the installation stand 14.

Position detecting sensors 19 are arranged near the respective positioning pins 16 on the top surface 14a of the installation stand 14. The position detecting sensors 19 detect whether the FOUP 2 is positioned and arranged at a predetermined position in the X-Y axis direction on the top surface 14a of the installation stand 14. The position detecting sensors 19 are not limited, and may be contact position detecting sensors or non-contact position detecting sensors. A lock mechanism 15 for locking the FOUP 2 is provided on the top surface 14a of the installation stand 14.

The opening and closing part 18 of the load port part 10 has the door 18a and a door driving part 18b. FIG. 3 shows a state where the opening and closing part 18 of the load port part 10 closes the delivery port 13, and FIG. 4 shows a state where the opening and closing part 18 opens the delivery port 13. The door 18a can open and close the delivery port 13 formed in a wall member 11 for separating the installation stand 14 and the wafer transportation room 52.

The door 18a can engage with the lid 4 of the FOUP 2 entered into the delivery port 13. As shown in FIG. 4, the opening and closing part 18 transports the door 18a engaged with the lid 4 into the wafer transportation room 52 using the door driving part 18b so as to open the main opening 2b of the FOUP 2. Incidentally, the opening and closing part 18 moves the door 18a toward the opposite direction to the direction at the time of opening using the door driving part 18b and returns the lid 4 to the first side surface 2d of the FOUP 2, so that the main opening 2b can be closed by the lid 4. After the main opening 2b is closed by the lid 4, the engagement between the door 18a and the lid 4 is released.

As shown in FIG. 4, the front gas introduction part 17 is arranged on an inner surface 11a. The inner surface 11a is a surface of the wall member 11 on the side of the wafer transportation room 52. The front gas introduction parts 17 are arranged on both sides in the X-axis direction sandwiching the delivery port 13 formed on the wall member 11, though FIG. 4 shows only one side.

The front gas introduction part 17 is connected to a supply passage 17b for supply a cleaning gas to the front gas introduction part 17. The front gas introduction part 17 is provided with blow nozzles 17a directed toward the delivery port 13. As shown in FIG. 4, the cleaning gas blown from the blow nozzles 17a of the front gas introduction part 17 is introduced into the FOUP 2 via the main opening 2b along with the downward current of the wafer transportation room 52 introduced into the FOUP 2 via the current plate 55 in a state where the main opening 2b of the FOUP 2 is opened and the inside of the FOUP 2 is communicated with the wafer transportation room 52.

As shown in FIG. 3, the gas discharge part 20 is arranged in the lower part in the Z-axis direction of the installation stand 14. The gas discharge part 20 has a first bottom nozzle 21 capable of communicating with the first bottom hole 5 formed at a position distant from the main opening 2b more than a bottom surface middle "C" on the bottom surface 2f of the FOUP 2. As shown in FIG. 2, the gas discharge part 20 has two first bottom nozzles 21. As shown in FIG. 3, each of the first bottom nozzles 21 can be respectively communicated with two first bottom holes 5 formed on the bottom surface 2f of the FOUP 2. The bottom surface middle "C" of the FOUP 2 shown in FIG. 3 means a position that is equidistant from the first side surface 2*d* where the lid 4 is arranged and the second side surface 2*e* opposing to the first side surface 2*d*.

The first bottom nozzles 21 are movable up and down along the Z-axis direction, and are housed in the installation stand 14 in a state where the FOUP 2 is not installed on the installation stand 14. As shown in FIG. 3, the first bottom nozzles 21 rise upward in the Z-axis direction after the FOUP 2 is fixed on the installation stand 14 and protrude from the top surface 14*a* of the installation stand 14 so as to connect to the first bottom holes 5 of the FOUP 2. Valves not shown for opening and closing the first bottom holes 5 are attached to the first bottom holes 5 of the FOUP 2. The valves are opened when the first bottom nozzles 21 are connected to the first bottom holes 5, and the first bottom nozzles 21 and the first bottom holes 5 are communicated with each other.

The gas discharge part 20 has a first pipe part 22 as a gas discharge passage connected to the first bottom nozzle 21 and capable of discharging the gas in the FOUP 2 to the outside via the first bottom nozzle 21. Furthermore, the gas discharge part 20 has a forcible discharge means 24 arranged in the first pipe part 22 and forcibly discharging the gas in the FOUP 2. One of end portions of the first pipe part 22 is connected to the first bottom nozzle 21, and the other end portion is connected to a discharge port 22*a* opening toward the outside of the load port part 10.

The forcible discharge means 24 absorbs the gas in the FOUP 2 and forcibly discharges the gas in the FOUP 2 via the first bottom hole 5 and the first bottom nozzle 21. The forcible discharge means 24 is not limited as long as the gas in the FOUP 2 can be absorbed, and may be a suction pump, an air blowing fan, or the like. Incidentally, the forcible discharge denotes a discharge for positively absorbing a gas in the FOUP 2 into the first pipe part 22.

In addition to the gas discharge part 20, the bottom gas introduction part 30 is arranged in the lower part in the Z-axis direction of the installation stand 14. The bottom gas introduction part 30 has a second bottom nozzle 31 capable of communicating with the second bottom hole 6 formed at a position nearer to the main opening 2*b* than to the bottom surface middle "C" on the bottom surface 2*f* of the FOUP 2. As shown in FIG. 2, the bottom gas introduction part 30 has two second bottom nozzles 31 capable of being exposed from the installation stand 14. As shown in FIG. 4, each of the second bottom nozzles 31 can be respectively communicated with two second bottom holes 6 formed on the bottom surface 2*f* of the FOUP 2.

The second bottom nozzles 31 are also movable up and down along the Z-axis direction in the same manner as the first bottom nozzles 21. Valves not shown for opening and closing the second bottom holes 6 are attached to the second bottom holes 6 of the FOUP 2, which is also the same as the first bottom holes 5.

The bottom gas introduction part 30 has a second pipe part 32 connected to the second bottom nozzle 31. A cleaning gas is supplied to the second bottom nozzle 31 via the second pipe part 32. The bottom gas introduction part 30 introduces the cleaning gas into the FOUP 2 via the second bottom hole 6 of the FOUP 2 and the second bottom nozzle 31 communicated with the second bottom hole 6.

The cleaning gas introduced from the front gas introduction part 17 and the bottom gas introduction part 30 into the FOUP 2 is not limited, and may be, for example, a nitrogen gas, another inert gas, a cleaned air where dust is removed by a filer or so, or the like. As shown in FIG. 1, the gas circulating in the wafer transportation room 52 and the circulating passage 57 may be also a nitrogen gas, another inert gas, a cleaned air, or the like. When the gas circulating in the wafer transportation room 52 and the circulating passage 57 is an inert gas, for example, an introduction port of the inert gas is provided at a position in the circulating passage 57 so as to introduce the inert gas from the introduction port into the wafer transportation room 52 and the circulating passage 57 as necessary.

Figure 5:
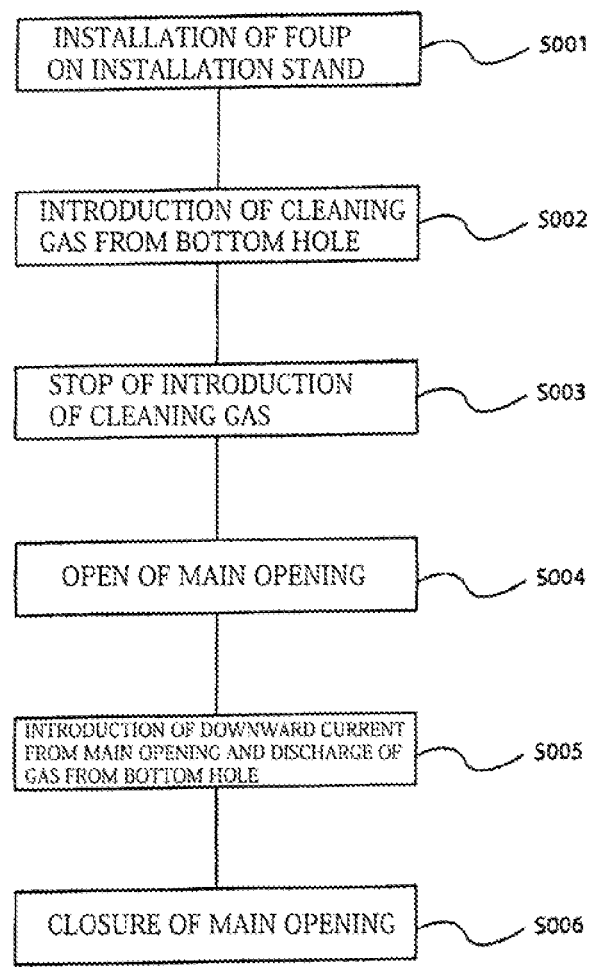
FIG. 5 is a flowchart showing a cleaning method of the inside of the EFEM shown in FIG. 1.

FIG. 5 is a flowchart showing cleaning steps of the inside of the FOUP 2 carried out in the EFEM 50 shown in FIG. 1. Hereinafter, the cleaning steps of the inside of the FOUP 2 will be described using FIG. 5 etc.

In Step S001 shown in FIG. 5, the FOUP 2 housing the wafers 1 before being processed is installed on the installation stand 14 of the load port part 10. The FOUP 2 is automatically transported to the installation stand 14 of the load port part 10 by a ceiling transport system, for example, but a method for transporting the FOUP 2 is not limited. Incidentally, as shown in FIG. 1, the wafer transportation part 51 of the EFEM 50 constantly forms a circulating current in the wafer transportation room 52 by continuing the driving of the transportation room fan 59 even in a state where the delivery port 13 is closed.

In an installation step of the FOUP 2 shown in Step S001, the load port part 10 drives the lock mechanism 15 so as to fix the FOUP 2 to the installation stand 14 after the position detecting sensors 19 shown in FIG. 2 confirm that the FOUP 2 is installed at an appropriate position.

After the FOUP 2 is installed on the installation stand 14 (Step S001), the step shown in Step S002 (see FIG. 7) begins, and the load port part 10 introduces the cleaning gas from the second bottom holes 6 of the FOUP 2 into the FOUP 2.

As shown in FIG. 3, in Step S002, the load port part 10 raises the second bottom nozzles 31 of the bottom gas introduction part 30 so as to respectively communicate the two second bottom nozzles 31 with the two second bottom holes 6 arranged on the FOUP 2. Furthermore, the load port part 10 carries out a first cleaning step of supplying the cleaning gas from the second pipe part 32 of the bottom gas introduction part 30 to the second bottom nozzles 31 and introducing the cleaning gas into the FOUP 2 via the second bottom holes 6.

In Step S002, the load port part 10 raises the first bottom nozzles 21 of the gas discharge part 20 so as to communicate them with the two first bottom holes 5 arranged on the FOUP 2 at the same time as the rising of the second bottom nozzles 31 or before or after the rising of the second bottom nozzles 31. This makes it possible to discharge the gas in the FOUP 2 to the outside of the FOUP 2 via the first bottom nozzles 21 and makes it possible to more smoothly introduce the cleaning gas from the second bottom nozzles 31 to the FOUP 2.

In Step S002, the cleaning gas is introduced in a state where the main opening 2*b* of the FOUP 2 is closed by the lid 4. In other embodiments different from the embodiment shown in FIG. 5, however, the introduction of the cleaning gas into the FOUP 2 using the second bottom nozzles 31 may be continuously carried out even after the main opening 2*b* of the FOUP 2 is opened.

Next, in Step S003 (see FIG. 5), the load port part 10 stops the introduction of the cleaning gas into the FOUP 2 via the second bottom holes 6 and the bottom gas introduction part 30. The load port part 10 stops the introduction of the cleaning gas into the FOUP 2 by stopping the supply of the cleaning gas from the second pipe part 32 to the second bottom nozzles 31. Incidentally, the communication state between the second bottom nozzles 31 and the second bottom holes 6 may be released by lowering the second bottom nozzles 31, or may be maintained in the same manner as when the cleaning gas is being introduced. This is the case with the communication state between the first bottom nozzles 21 and the first bottom holes 5.

Step S003 is carried out at any time, and for example, may be carried out at a time when an introduction time of the cleaning gas from the second bottom nozzles 31 reaches a predetermined time, or may be carried out at a time when the fact that a cleanliness of the gas discharged from the FOUP 2 reaches a predetermined level is detected.

Incidentally, the load port part 10 moves the installation stand 14 in the Y-axis direction (positive direction) so as to move the FOUP 2 fixed on the installation stand 14 to a position where the first side surface 2d of the FOUP 2 enters the delivery port 13 in parallel with the introduction and stop steps of the cleaning gas shown in Step S002 and Step S003 or before the introduction of the cleaning gas or after the stop of the introduction of the cleaning gas (see FIG. 4).

In Step S004 (see FIG. 5), the load port part 10 opens the main opening 2b of the FOUP 2. In Step S004, the load port part 10 engages the door 18a of the opening and closing part 18 with the lid 4 of the FOUP 2 moved to the position shown in FIG. 4 in advance. Furthermore, the door 18a is moved by the door driving part 18b so as to remove the lid 4 from the portion where the wafers are housed in the FOUP 2 and open the main opening 2b. The removed lid 4 is moved along with the door 18a to a position where the transportation of the wafers 1 by the transportation robot 54 is not disturbed.

Next, in Step S005 (see FIG. 5), the current plate 55 arranged in the wafer transportation room 52 allows a part of the downward current 80 formed in the wafer transportation room 52 to flow into the FOUP 2 connected to the wafer transportation room 52 via the main opening 2b. Furthermore, a second cleaning step of the FOUP 2 is carried out by discharging the gas in the FOUP 2 via the first bottom holes 5 formed at a position distant from the main opening 2b more than the bottom surface middle "C". Incidentally, as shown in FIG. 4, the load port part 10 may inject the cleaning gas from the blow nozzles 17a of the front gas introduction parts 17 toward the main opening 2b so as to introduce the cleaning gas into the FOUP 2 along with the downward current 80.

In Step S005, the gas discharge part 20 of the load port part 10 discharges the gas in the FOUP 2 via the first bottom holes 5 in a state where the first bottom nozzles 21 are communicated with the first bottom holes 5 of the FOUP 2. Incidentally, when the communication state between the first bottom nozzles 21 and the first bottom holes 5 is released in Step S003 mentioned above, the bottom nozzles 21 are raised once again to communicate with the first bottom holes 5 in Step S005.

Furthermore, in Step S005, the load port part 10 can forcibly discharge the gas in the FOUP 2 by operating the forcible discharge means 24 of the gas discharge part 20. It is possible to select whether a forcible discharge is carried out or a spontaneous discharge where the gas in the FOUP 2 is pushed out from the first bottom holes 5 by the downward current 80 introduced from the main opening 2b is carried out depending upon kind or amount of an outgas that may occur from the wafers 1, the number of wafers 1 housed in the FOUP 2, and the like.

While the load port part 10 is carrying out the step shown in Step S005, the wafer transportation part 51 shown in FIG. 1 operates an arm 54a of the transportation robot 54 so as to take out the wafers 1 before being processed and transport them to the processing room via the wafer transportation room 52. The wafer transportation part 51 operates the arm 54a of the transportation robot 54 so as to transport the wafers 1 processed in the processing room to the FOUP 2 via the wafer transportation room 52.

After all of the processed wafers 1 are returned to the FOUP 2, the opening and closing part 18 of the load port part 10 closes the main opening 2b of the FOUP 2 (Step S006). The load port part 10 moves the door 18a by the door driving part 18b shown in FIG. 4 and returns the lid 4 engaged with the door 18a to the first side surface 2d of the FOUP 2, so that the main opening 2b is closed. After the lid 4 closes the main opening 2b, the engagement between the door 18a and the lid 4 is released. After Step S006, the load port part 10 moves the installation stand 14 in the Y-axis direction (negative direction) so as to return the FOUP 2 housing the processed wafers 1 to the position of the installation step (Step S001) shown in FIG. 3.

Incidentally, when the main opening 2b of the FOUP 2 is closed, the load port part 10 stops the discharge of the gas from the first bottom holes 5 by stopping the forcible discharge means 24 if a forcible discharge is carried out in Step S005. When the cleaning gas is blown from the front gas introduction part 17 in Step S005, the load port part 10 stops the blowing of the cleaning gas by the front gas introduction part 17 in accordance with the closure of the main opening 2b. The wafer transportation part 51, however, continues to drive the transportation room fan 59 and continues to form the circulating current in the wafer transportation room 52 and the circulating passage 57 so as to maintain the cleanliness of the wafer transportation room 52.

Accordingly, the EFEM 50 allows a part of the downward current to flow into the FOUP 2 via the main opening 2b of the FOUP 2 taking in and out the wafers 1 by introducing the downward current of the wafer transportation room 52 due to the current plate 55 in a state where the main opening 2b of the FOUP 2 is airtightly connected to the wafer transportation room 52. In this case, the EFEM 50 connects the first bottom nozzles 21 of the gas discharge part 20 to the first bottom holes 5 distant from the main opening 2b of the FOUP 2 and discharges the gas in the FOUP 2. This allows the EFEM 50 to effectively discharge the outgas generated from the processed wafers 1 to the outside of the FOUP 2 while the wafers 1 are being taken in and out via the main opening 2b. That is, the main opening 2b has a wide opening area, and the downward current for maintaining the cleanliness is formed in the wafer transportation room 52, whereby the gas in the wafer transportation room 52 easily flows into the FOUP 2 due to the introduction of the downward current by the current plate 55.

The cleaning step (second cleaning step) of the FOUP 2 by the EFEM 50 can be carried out with a simple configuration where the current plate 55 is arranged in the wafer transportation room 52, and the first bottom nozzles 21 for discharging the gas are connected to the first bottom holes 5.

The gas in the FOUP 2 is discharged from the first bottom holes 5 distant from the main opening 2b, and thus a current going from the main opening 2b to the first bottom holes 5 is formed in the entire inside of the FOUP 2 housing the wafers 1. Then, the current formed in the FOUP 2 passes near the surfaces of the wafers 1, which promotes the discharge of the outgas. This allows the EFEM 50 to prevent a problem that the wafers 1 in the FOUP 2 are oxidized or contaminated due to the outgas generated from the processed wafers 1.

Incidentally, the first bottom holes 5 discharging the gas in the FOUP 2 are preferably formed at a position distant from the main opening 2b as much as possible in view of forming a current discharging the outgas in the entire inside of the FOUP 2. Thus, the distance from the first bottom holes 5 to the main opening 2b is preferably two thirds or more of diameters of the housed wafers 1, and is more preferably diameters or more of the wafers 1.

In the above-mentioned cleaning method of the FOUP 2 by the EFEM 50, the first cleaning step (STEP S003) of introducing the cleaning gas from the second bottom holes 6 of the FOUP 2 is carried out so as to clean the inside of the FOUP 2 and effectively protect the wafers 1 from oxidation and contamination even in a state where the main opening 2b is closed. The second cleaning step (Step S005) of introducing the gas from the main opening 2b is carried out in a state where the introduction of the cleaning gas from the second bottom holes 6 is stopped, which increases the inflow amount of the gas from the main opening 2b and forms a more favorable current for discharging the outgas in the entire inside of the FOUP 2.

In the EFEM 50, the forcible discharge means 24 discharges the gas in the FOUP 2 so as to effectively introduce the gas in the wafer transportation room 52 from the main opening 2b into the FOUP 2, and the current is formed in the FOUP 2 so as to effectively discharge the outgas generated from the processed wafers 1.

Furthermore, in the above-mentioned EFEM 50, the first pipe part 22 of the load port part 10 functions as a discharge passage for discharging the gas from the FOUP 2 in both the first cleaning step (Step S003) of introducing the cleaning gas from the second bottom holes 6 and the second cleaning step (Step S005) of introducing the downward current of the wafer transportation room 52 via the main opening 2b. Thus, the EFEM 50 makes it possible to achieve two kinds of cleaning steps having different modes with a simple configuration.

Accordingly, the present invention is described by showing the embodiment, but the above-mentioned EFEM 50 is just an embodiment of the present invention, and variations other than the embodiment are included within the technical scope of the present invention.

For example, in the EFEM 50, the gas discharge part 20 has the two first bottom nozzles 21 capable of communicating with the two first bottom holes 5, but there is no limit to the number of the first bottom nozzles 21 owned by the gas discharge part 20, and there is no limit to the number of the first bottom holes 5 connectable to the first bottom nozzles 21. Also, there is no limit to the number of the second bottom nozzles 31 owned by the bottom gas introduction part 30, and there is no limit to the number of the second bottom holes 6 connectable to the second bottom nozzles 31.

Figure 6:
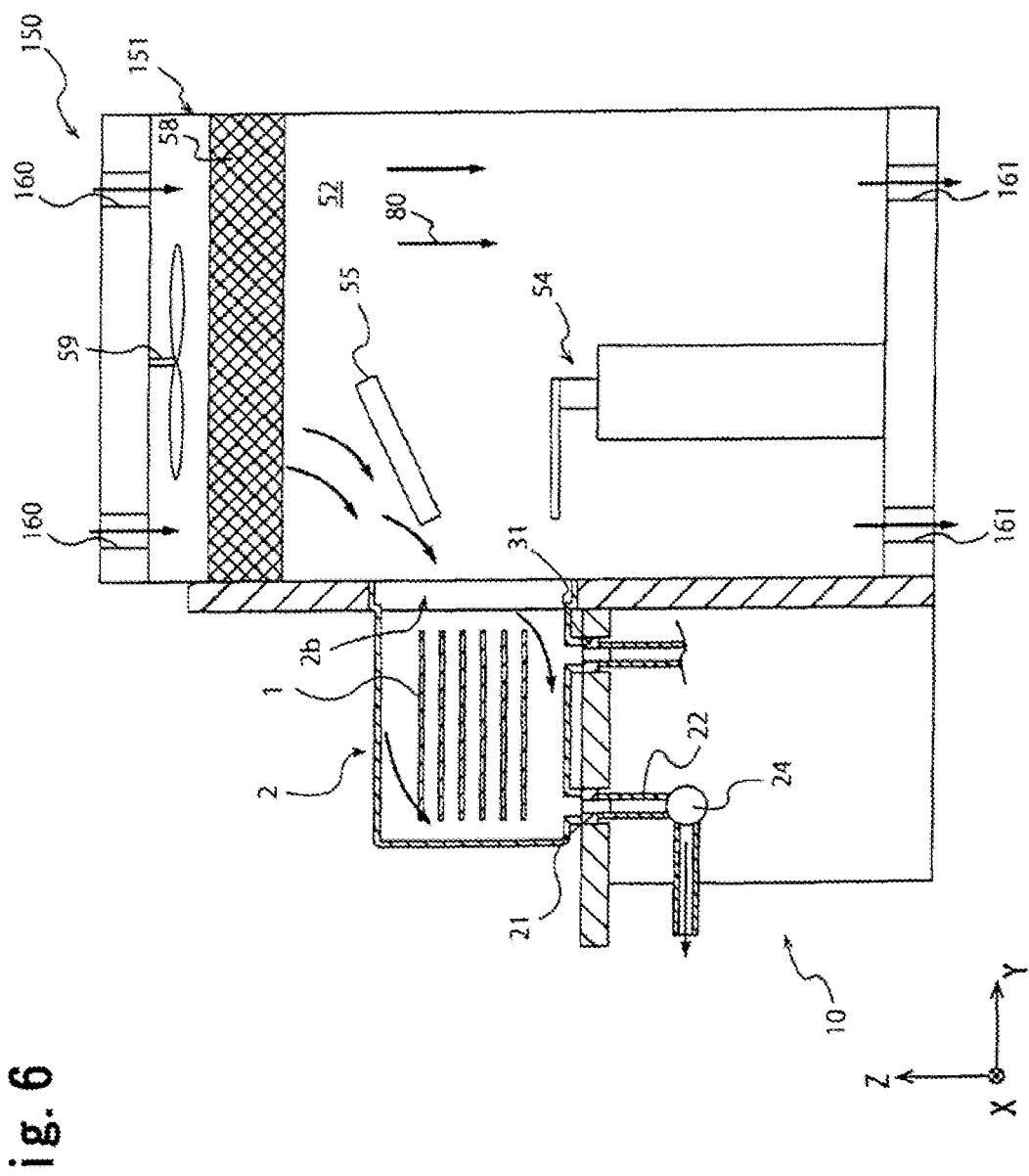
FIG. 6 is a schematic view of an EFEM according to Second Embodiment of the present invention.

FIG. 6 is a schematic cross sectional view showing an EFEM 150 according to Second Embodiment of the present invention. The EFEM 150 is the same as the EFEM 50 according to First Embodiment except that a wafer transportation part 151 does not have the circulating passage 57 but has introduction ports 160 arranged over the wafer transportation room 52 and discharge ports 161 arranged below the wafer transportation room 52. Incidentally, the descriptions of the front gas introduction part 17, the lid 4, the opening and closing part 18, and the like are omitted in FIG. 6.

In a second cleaning step of the EFEM 150 shown in FIG. 6, an air or an inert gas is introduced from the introduction ports 160 arranged over the transportation room 52. The air or inert gas introduced above the wafer transportation room 52 passes through the transportation room filter 58, flows into the wafer transportation room 52, and is thereafter discharged from the discharge ports 161 arranged below the wafer transportation room 52. A downward current by the transportation room fan 59 is also formed in the wafer transportation room 52 of the EFEM 150 in the same manner as First Embodiment shown in FIG. 1. The second cleaning step in the EFEM 150 shown in FIG. 6 demonstrates the same effect as the EFEM 50 shown in FIG. 1 by introducing a part of the downward current 80 into the FOUP 2 using the current plate 55 and further carrying out a cleaning step of the FOUP 2 for discharging the gas in the FOUP 2 from the first bottom nozzles 21.

Figure 7:
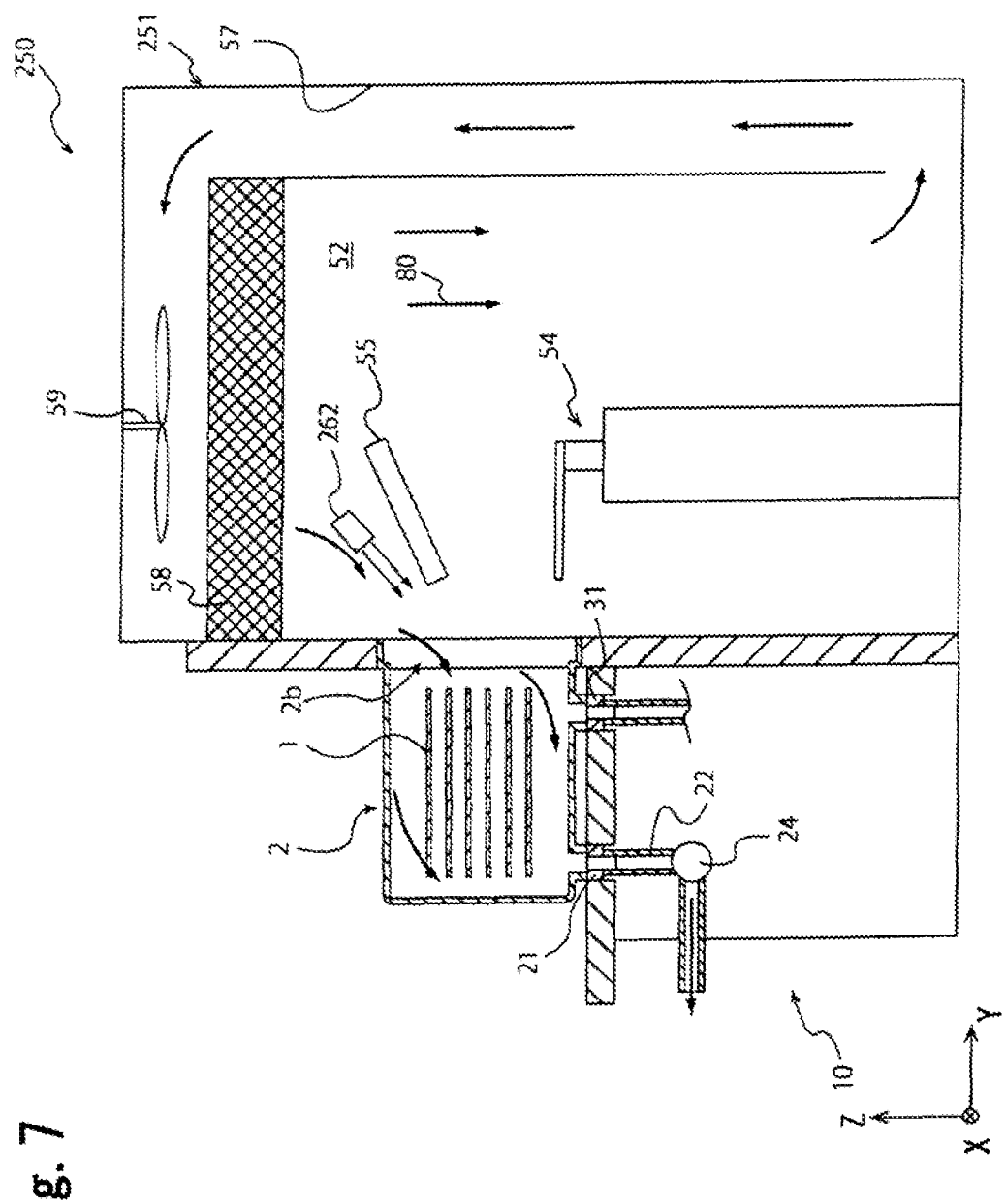
FIG. 7 is a schematic view of an EFEM according to Third Embodiment of the present invention.

FIG. 7 is a schematic cross sectional view showing an EFEM 250 according to Third Embodiment of the present invention. The EFEM 250 is the same as the EFEM 50 shown in FIG. 1 except that a wafer transportation part 251 has a transportation room blow nozzle 262 as a gas discharge means in addition to the current plate 55. The transportation room blow nozzle 262 is arranged in the wafer transportation room 52 and blows a cleaning gas from the wafer transportation room 52 toward the main opening 2b of the FOUP 2.

A cleaning gas is supplied from a pipe part not shown to the transportation room blow nozzle 262. The cleaning gas blown from the transportation room blow nozzle 262 may be an inert gas, a clean air, or the like in the same manner as the cleaning gas blown from the second bottom nozzles 31, but preferably has a higher cleanliness than that of a gas in the wafer transportation room 52 constituting the downward current 80.

In the EFEM 250 shown in FIG. 7, the wafer transportation part 251 has the transportation room blow nozzle 262, which promotes the inflow of the gas from the main opening 2b into the FOUP 2 and the replacement of the gas in the FOUP 2 in the second cleaning step. This allows the EFEM 250 to effectively prevent a problem that the outgas generated from the processed wafers 1 adversely affects the nearby wafers 1. The EFEM 250 demonstrates the same effect as the EFEM 50 shown in FIG. 1.

Figure 8:
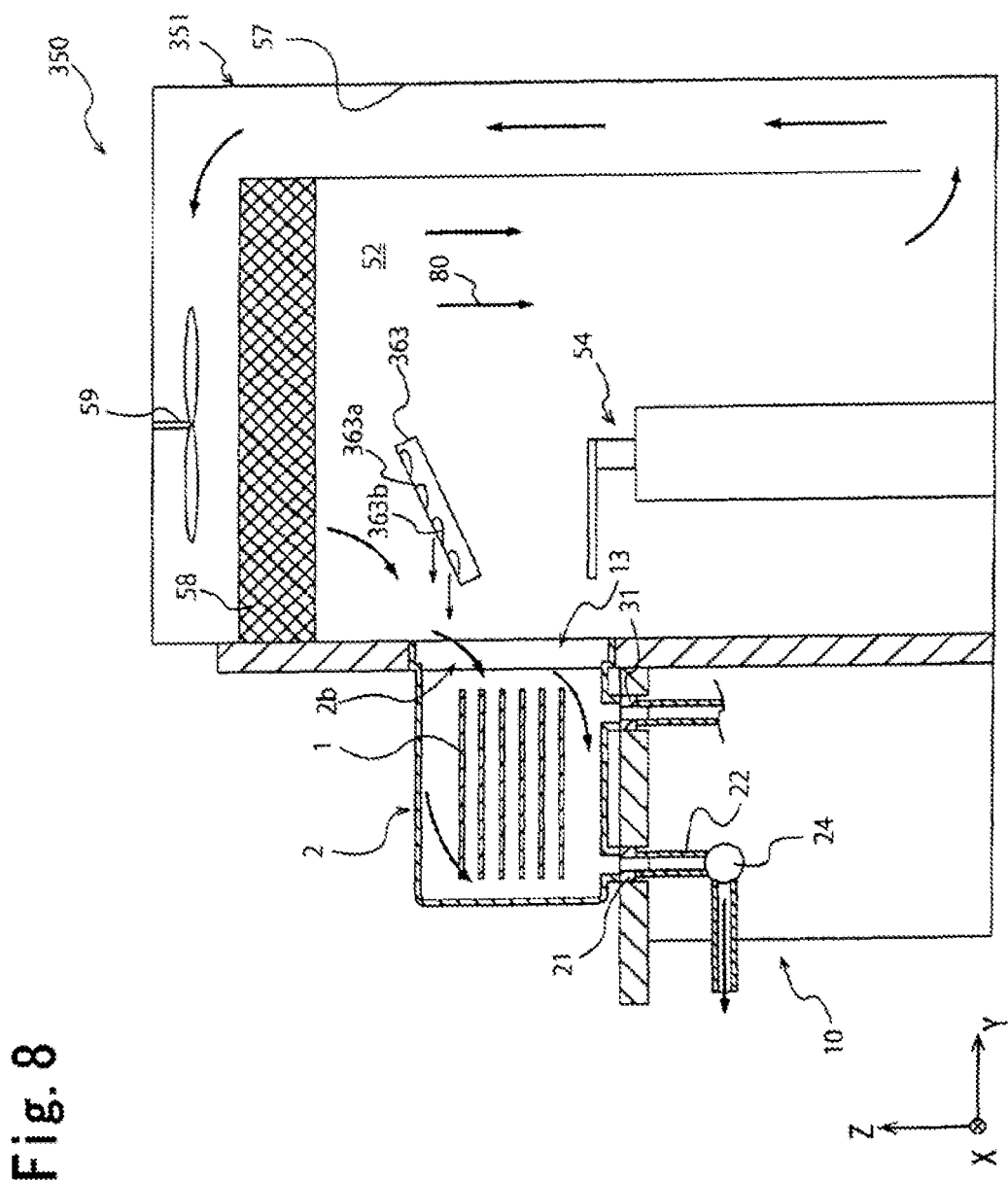
FIG. 8 is a schematic view of an EFEM according to Fourth Embodiment of the present invention.

FIG. 8 is a schematic cross sectional view showing an EFEM 350 according to Fourth Embodiment of the present invention. The EFEM 350 is the same as the EFEM 50 shown in FIG. 1 except that a wafer transportation part 351 has a blow nozzle integrated current plate 363 instead of the current plate 55. As is the case with the current plate 55 shown in FIG. 1, the blow nozzle integrated current plate 363 is arranged near the delivery port 13 in the wafer transportation room 52 and introduces a part of a downward current formed in the wafer transportation room 52 into the FOUP 2 by an inclined surface 363a in the second cleaning step.

A plurality of blow nozzles 363b is formed on the inclined surface 363a of the blow nozzle integrated current plate 363, and a cleaning gas is blown from the blow nozzles 363b toward the main opening 2b of the FOUP 2. The cleaning gas is supplied from a pipe part not shown to the blow nozzles 363b. The cleaning gas blown from the blow nozzles 363b is the same as the cleaning gas blown from the transportation room blow nozzle 262 of the EFEM 250 according to Third Embodiment.

The EFEM 350 shown in FIG. 8 has the blow nozzle integrated current plate 363 functioning both the current plate 55 and the transportation room blow nozzle 262 of the EFEM 250 shown in FIG. 7, and thus can prevent a problem that the outgas generated from the processed wafers 1 adversely affects the nearby wafers 1 with a simple configuration. The EFEM 350 demonstrates the same effect as the EFEM 50 shown in FIG. 1.

Figure 9:
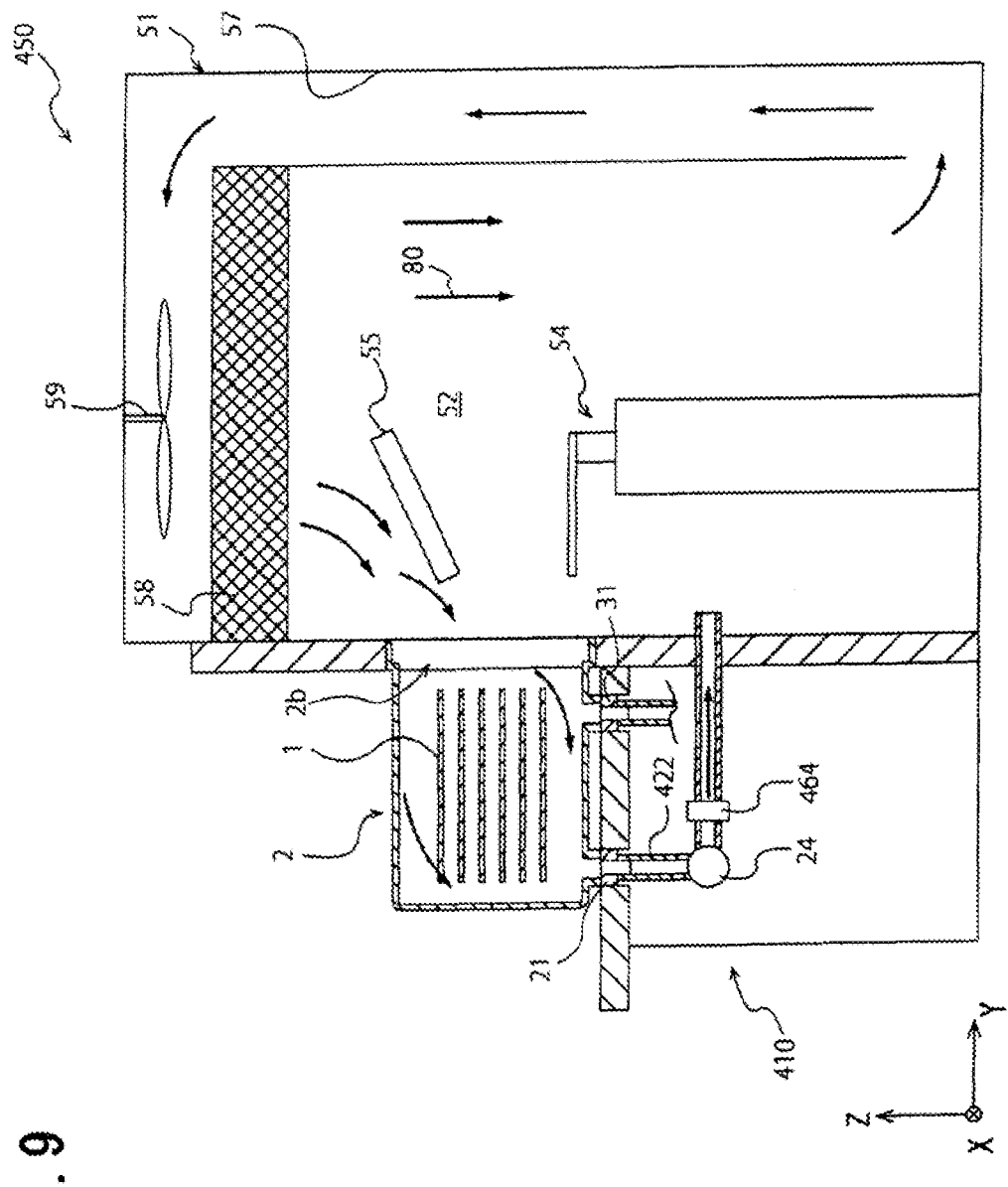
FIG. 9 is a schematic view of an EFEM according to Fifth Embodiment of the present invention.

FIG. 9 is a schematic cross sectional view showing an EFEM 450 according to Fifth Embodiment of the present invention. The EFEM 450 is the same as the EFEM 50 shown in FIG. 1 except that a first pipe part 422 as a gas discharge passage in a load port part 410 is connected to the wafer transportation room 52. In a second cleaning step of the EFEM 450, a gas discharged from the FOUP 2 via the first bottom nozzles 21 is returned to the wafer transportation room 52 via the first pipe part 422.

The first pipe part 422 is provide with a pipe filter 464 for removing contaminants contained in the gas discharged from the FOUP 2. Thus, the gas discharged from the FOUP 2 flows into the wafer transportation room 52 after the contaminants are removed by the pipe filter 464 in the second cleaning step of the EFEM 450. The pipe filter 464 removes the contaminants contained in the gas discharged from the FOUP 2 in the load port part 410 and prevents a problem of decrease in cleanliness in the wafer transportation room 52 due to inflow of contaminants.

In the EFEM 450 shown in FIG. 9, the first pipe part 422 is connected to the wafer transportation room 52, and the gas in the wafer transportation room 52 and the FOUP 2 connected thereto can thus circulate in the entire EFEM 450. Thus, the transportation room filter 58 of the wafer transportation part 51 can clean the gas circulating the entire EFEM 450 and improve the cleanliness of the entire EFEM 450. The EFEM 450 demonstrates the same effect as the EFEM 50 shown in FIG. 1.

Figure 10:
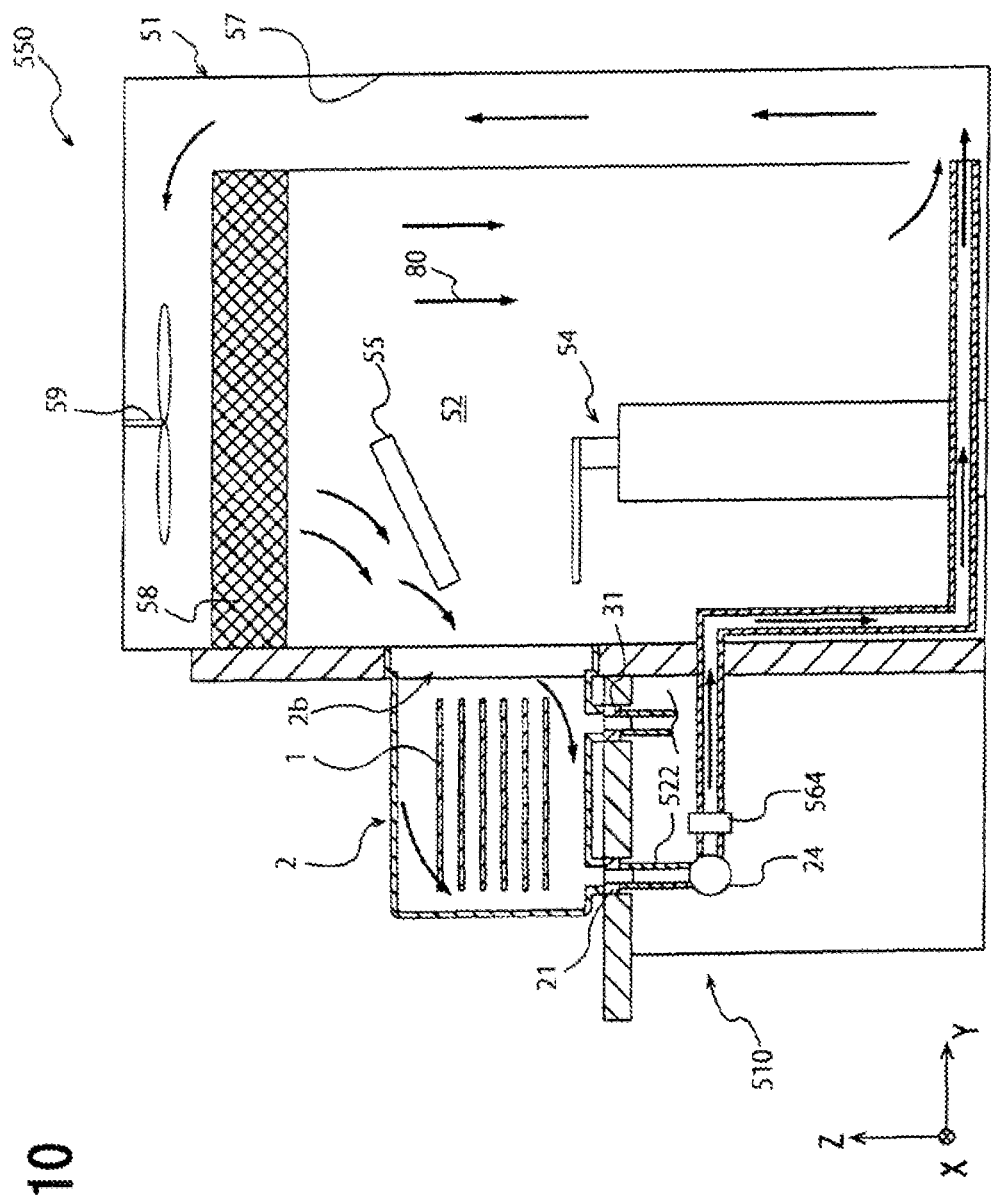
FIG. 10 is a schematic view of an EFEM according to Sixth Embodiment of the present invention.

FIG. 10 is a schematic cross sectional view showing an EFEM 550 according to Sixth Embodiment of the present invention. The EFEM 550 is the same as the EFEM 50 shown in FIG. 1 except that a first pipe part 522 as a gas discharge passage in a load port part 510 is connected to the circulating passage 57 of the wafer transportation part 51. In a second cleaning step of the EFEM 550, a gas discharged from the FOUP 2 via the second bottom nozzles 21 is returned to the circulating passage 57 via the first pipe part 522.

As is the case with the first pipe part 422 shown in FIG. 9, the first pipe part 522 is provided with a pipe filter 564 for removing contaminants. In the EFEM 550 shown in FIG. 10, the first pipe part 522 is connected to the circulating passage 57, and thus the gas in the wafer transportation room 52 and the FOUP 2 connected thereto can circulate in the entire EFEM 550 in the same manner as the EFEM 450 shown in FIG. 9. Incidentally, the present embodiment includes not only the configuration where the first pipe part 522 is physically connected to the middle part of the circulating passage 57, but also the configuration where the tip of the first pipe part 522 is opened toward the inflow port of the circulating passage 57.

In the EFEM 550 shown in FIG. 10, the first pipe part 522 is not connected to the wafer transportation room 52 but to the circulating passage 57. Thus, in a second cleaning step of the EFEM 550, the gas discharged from the FOUP 2 via the second bottom nozzles 21 passes through the transportation room filter 58 via the first pipe part 522 and the circulating passage 57 and thereafter returns to the wafer transportation room 52. Thus, even if the gas discharged from the FOUP 2 contains contaminants, the contaminants do not directly flow into the wafer transportation room 52, and it is thereby possible to prevent a problem that contaminants due to the outgas are adhered to the wafers being transported in the wafer transportation room 52. The EFEM 550 demonstrates the same effect as the EFEM 50 shown in FIG. 1.

Figure 11:
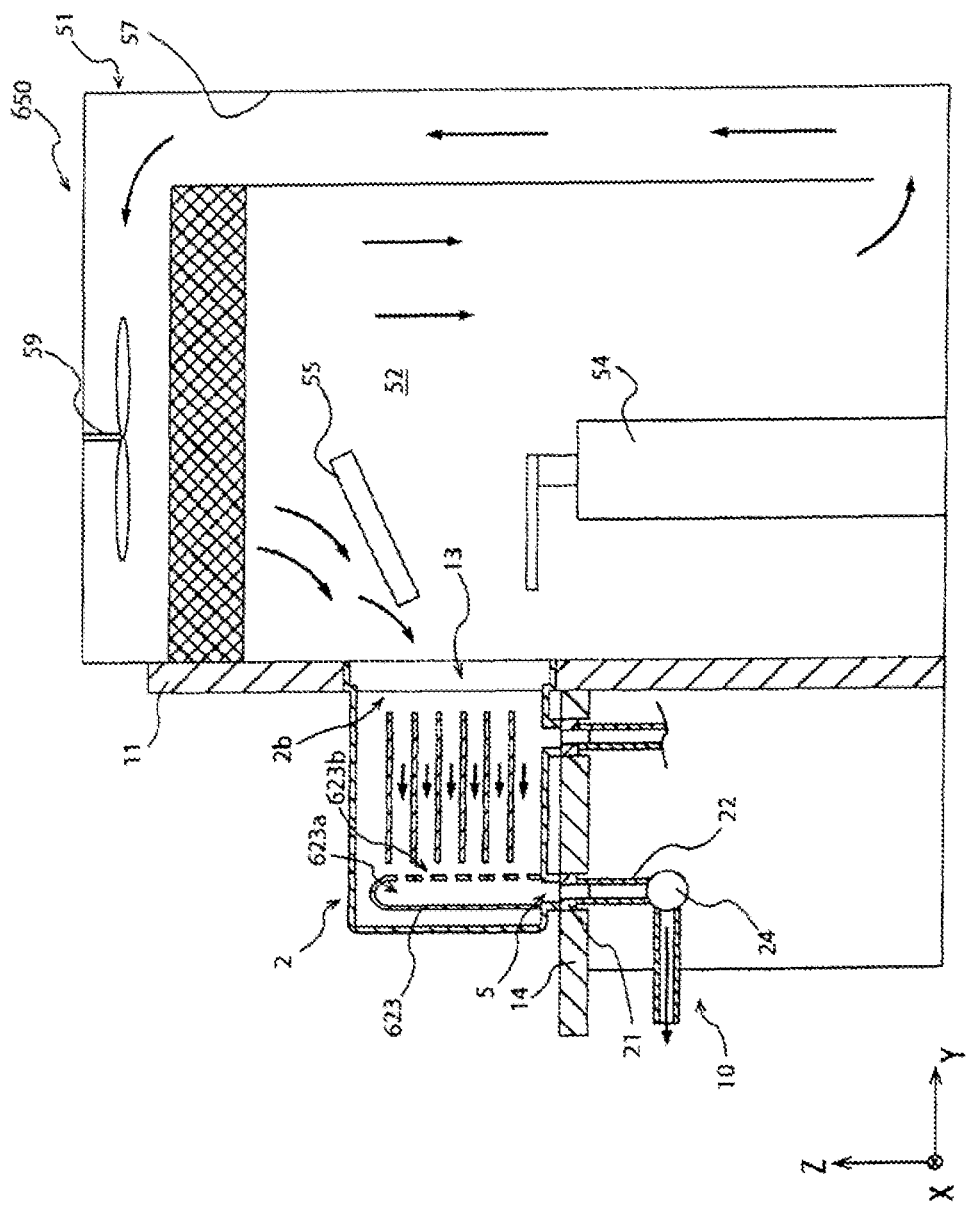
FIG. 11 is a schematic view of an EFEM according to Seventh Embodiment of the present invention.

FIG. 11 is a schematic cross sectional view showing an EFEM 650 according to Seventh Embodiment of the present invention. The EFEM 650 is the same as the EFEM 50 shown in FIG. 1 except that the EFEM 650 has a FOUP inner nozzle 623 standing upright in the FOUP 2. The FOUP inner nozzle 623 is hollow, and a container inner passage 623*a* communicating with the first bottom nozzles 21 via the first bottom holes 5 is formed inside the FOUP inner nozzle 623. Passage openings 623*b* connecting to the container inner passage 623*a* are intermittently formed in the up and down direction on the surface of the FOUP inner nozzle 623.

In a second cleaning step of the EFEM 650, the gas is discharged from the inside of the FOUP 2 via the FOUP inner nozzle 623 standing upright from the first bottom holes 5 toward the inside of the FOUP 2, and thus a current along the surfaces of the wafers 1 housed in the FOUP 2 is formed. It is thus possible to effectively prevent a problem that the outgas generated from one wafer 1 contaminates the surfaces of other wafers 1 arranged in the up and down direction, for example.

Figure 12:
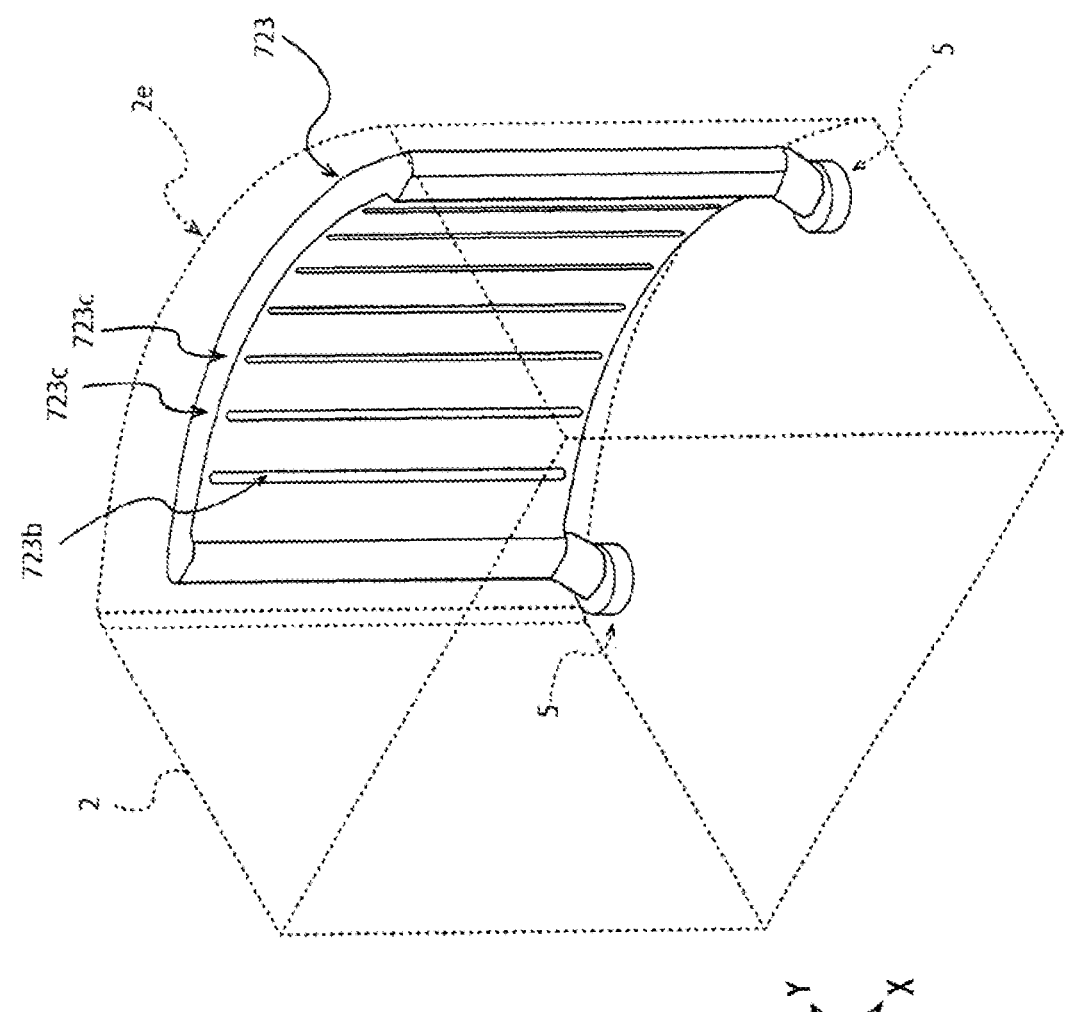
FIG. 12 is a schematically perspective view of a blow nozzle shown in FIG. 11.

FIG. 12 is a schematically perspective view showing a FOUP inner nozzle 723 according to a variation of the FOUP inner nozzle 623 equipped with the EFEM 650 shown in FIG. 11. The FOUP inner nozzle 723 is also hollow as with the FOUP inner nozzle 623 shown in FIG. 11, and a container inner passage is formed inside of the FOUP inner nozzle 723.

Passage openings 723*b* connecting to the container inner passage are formed continuously in the up and down direction on the surface of the FOUP inner nozzle 723 standing upright in the FOUP 2. The FOUP inner nozzle 723 has a plurality (seven arrays in an example of FIG. 12) of opening arrays 723*c* constituted by the passage openings 723*b* arranged in the up and down direction. The opening arrays 723*c* are arranged along a direction perpendicular to the up and down direction and along an approximately parallel direction to the second side surface 2*e* of the FOUP 2.

The EFEM 650 having the FOUP inner nozzle 623 or 723 can more effectively discharge the outgas generated from the wafers 1 to the outside of the FOUP 2. A current for more efficiently discharging the outgas from the wafers can be formed in the entire FOUP 2 by having a plurality of the opening arrays 723*c*.

NUMERICAL REFERENCES

1 . . . wafer
2 . . . FOUP
2*f* . . . bottom surface
4 . . . lid
5 . . . first bottom hole
6 . . . second bottom hole
10, 100 . . . load port part
11 . . . wall member
14 . . . installation stand
17 . . . front gas introduction part
17*a* . . . blow nozzle
18 . . . opening and closing part
18*a* . . . door
20 . . . gas discharge part
21 . . . first bottom nozzle
22 . . . first pipe part
24 . . . forcible discharge means
30 . . . bottom gas introduction part 31 . . . second bottom nozzle
32 . . . second pipe part
55 . . . current plate
50, 150 . . . EFEM
51, 151 . . . wafer transportation part
52, 152 . . . wafer transportation room
57 . . . circulating passage
59 . . . transportation room fan
80 . . . downward current
"C" . . . bottom surface middle

The invention claimed is:

1. An EFEM comprising:
a load port part configured to connect, in an airtight manner, a main opening formed on a container to a wafer transportation room, the container housing a wafer, and the wafer transportation room being passed by the wafer as it is transported to a processing room;
a wafer transportation part disposed in the wafer transportation room, the wafer transportation part comprising:
a downward current generator configured to form a downward current in the wafer transportation room;
a current plate arranged in the wafer transportation room and configured to introduce a part of the downward current into the container connected to the wafer transportation room via the main opening;
a circulating passage where gas from the wafer transportation room detours and rises so as to form the downward current once again in the wafer transportation room; and
a circulating gas cleaner configured to clean gas circulating in the wafer transportation room and the circulating passage,
wherein the load port part comprises:
an installation stand configured to install the container;
a bottom nozzle configured to be capable of communicating with a bottom hole formed at a position distant from the main opening more than a bottom surface middle on a bottom surface of the container; and
a gas discharge passage configured to be capable of discharging gas in the container to an outside of the container via the bottom nozzle.

2. The EFEM according to claim 1, wherein
the load port part comprises a forcible discharger arranged in the gas discharge passage and configured to forcibly discharge the gas in the container.

3. The EFEM according to claim 1, further comprising a gas blower arranged in the wafer transportation room and configured to blow the gas from the wafer transportation room to the main opening.

4. The EFEM according to claim 2, further comprising a gas blower arranged in the wafer transportation room and configured to blow the gas from the wafer transportation room to the main opening.

5. The EFEM according to claim 1, wherein
the gas discharge passage is connected to the wafer transportation room.

6. The EFEM according to claim 2, wherein
the gas discharge passage is connected to the wafer transportation room.

7. The EFEM according to claim 1, wherein
the load port part comprises a discharge gas cleaner configured to clean the gas flowing in the gas discharge passage.

8. The EFEM according to claim 2, wherein
the load port part comprises a discharge gas cleaner configured to clean the gas flowing in the gas discharge passage.

9. The EFEM according to claim 1, wherein
the wafer transportation part comprises a circulating passage where the gas from the wafer transportation room detours and rises so as to form the downward current once again in the wafer transportation room, and
the gas discharge passage is connected to the circulating passage.

10. The EFEM according to claim 2, wherein
the wafer transportation part comprises a circulating passage where the gas from the wafer transportation room detours and rises so as to form the downward current once again in the wafer transportation room, and
the gas discharge passage is connected to the circulating passage.

11. An EFEM system, comprising:
the EFEM according to claim 1;
the container; and
a container inner nozzle standing upright inside the container, the container inner nozzle comprising:
a container inner passage formed inside the container inner nozzle and configured to communicate with the bottom nozzle via the bottom hole; and
a passage opening formed intermittently or continuously in an up and down direction on the container inner nozzle and configured to connect to the container inner passage.

12. An EFEM system, comprising:
the EFEM according to claim 2;
the container; and
a container inner nozzle standing upright inside the container, the container inner nozzle comprising:
a container inner passage formed inside the container inner nozzle and configured to communicate with the bottom nozzle via the bottom hole; and
a passage opening formed intermittently or continuously in an up and down direction on the container inner nozzle and configured to connect to the container inner passage.

13. The EFEM system according to claim 11, wherein the container inner nozzle comprises a plurality of opening arrays consisting of the passage opening, which is formed intermittently or continuously in the up and down direction on a surface of the container inner nozzle.

14. The EFEM system according to claim 12, wherein the container inner nozzle comprises a plurality of opening arrays consisting of the passage opening, which is formed intermittently or continuously in the up and down direction on a surface of the container inner nozzle.

* * * * *